United States Patent
Tazima et al.

(10) Patent No.: US 7,199,401 B2
(45) Date of Patent: Apr. 3, 2007

(54) LIGHT-EMITTING SEMICONDUCTOR DEVICE

(75) Inventors: Mikio Tazima, Niiza (JP); Masahiro Sato, Niiza (JP); Hidekazu Aoyagi, Niiza (JP); Tetsuji Matsuo, Niiza (JP)

(73) Assignee: Sanken Electric Co., Ltd. (JP)

( * ) Notice: Subject to any disclaimer, the term of this patent is extended or adjusted under 35 U.S.C. 154(b) by 169 days.

(21) Appl. No.: 11/058,942

(22) Filed: Feb. 16, 2005

(65) Prior Publication Data

US 2005/0184300 A1 Aug. 25, 2005

(30) Foreign Application Priority Data

Feb. 25, 2004 (JP) ............................. 2004-050378
Sep. 10, 2004 (JP) ............................. 2004-264342

(51) Int. Cl.
*H01L 27/15* (2006.01)
*H01L 29/22* (2006.01)

(52) U.S. Cl. ................... 257/99; 257/79; 257/103; 257/90; 257/98; 257/94; 257/613; 257/E33.064

(58) Field of Classification Search .............. 257/79, 257/99, 103, 613, 90, 94, 98, E33.064; 438/22, 438/455
See application file for complete search history.

(56) References Cited

U.S. PATENT DOCUMENTS 6,233,266 B1 * 5/2001 Kawasumi ............... 372/46.01

2005/0067613 A1 * 3/2005 Kim ........................... 257/14

FOREIGN PATENT DOCUMENTS

| JP | 11-004020 | 1/1999 |
| JP | 2002-217450 | 8/2002 |
| JP | 2003-224297 | 8/2003 |

* cited by examiner

*Primary Examiner*—Kenneth Parker
*Assistant Examiner*—Joseph Nguyen
(74) *Attorney, Agent, or Firm*—Woodcock Washburn LLP

(57) ABSTRACT

An LED includes a semiconductor region having an active layer sandwiched between two confining layers of opposite conductivity types for generating heat. A cathode is arranged centrally on one of the opposite major surfaces of the semiconductor region from which is emitted the light. Attached to the other major surface of the semiconductor region, via an ohmic contact layer, is a reflective metal layer for reflecting the light that has traversed the ohmic contact layer, back toward the semiconductor region. A transparent antidiffusion layer is interposed between the ohmic contact layer and the reflective layer in order to prevent the ohmic contact layer and the reflective layer from thermally diffusing from one into the other to the impairment of the reflectivity of the reflective layer.

15 Claims, 6 Drawing Sheets

LIGHT-EMITTING SEMICONDUCTOR DEVICE

CROSS REFERNCE TO RELATED APPLICATIONS

This application claims priority to Japanese Patent Application No. 2004-050378, filed Feb. 25, 2004, and Japanese Patent Application No. 2004-264342, filed Sep. 10, 2004.

BACKGROUND OF THE INVENTION

This invention relates to a light-emitting semiconductor device, or light-emitting diode (LED) according to more common parlance, and more particularly to such devices having active layers made from chemical compounds such for example as aluminum gallium arsenide (AlGaAs), aluminum gallium indium phosphide (AlGaInP), gallium nitride (GaN), aluminum gallium indium nitride (AlGaInN), and derivatives thereof. The invention also concerns a method of making such light-emitting semiconductor devices.

Compound semiconductors containing AlGaInP, for instance, represent familiar materials for the active layers of light-emitting semiconductor devices. An example of such devices has a substrate of gallium arsenide (GaAs) on which there are laminated a plurality of active semiconductor layers composed primarily of AlGaInP. The AlGaInP semiconductor layers are relatively easy to grow on the GaAs substrate by epitaxy.

One of the problems encountered with this conventional light-emitting device is that the GaAs substrate is highly absorptive of the light of the wavelength range emitted by the active semiconductor layers or the main semiconductor region of the light-emitting device. Much of the light that has issued from the active layers toward the substrate has been absorbed thereby, running counter to the objective of making the light-emitting device as high as feasible in efficiency.

A known remedy to this problem was to remove the GaAs substrate after epitaxially growing the active semiconductor layers thereon. A transparent support substrate of gallium phosphide (GaP) or the like, different from the removed growth substrate which had been used for epitaxial growth of the active semiconductor layers, was then bonded to the active semiconductor layers. Then a reflective electrode was formed on the support substrate. This remedy proved unsatisfactory, however, as the active semiconductor layers and the transparent support substrate gave rise to electrical resistance at the interface therebetween. This resistance made the forward voltage between the anode and cathode of the light emitting device inconveniently high.

A solution to this weakness of the known remedy is found in Japanese Unexamined Patent Publication No. 2002-217450. This prior patent application teaches the creation of a thin, open-worked layer of gold-germanium-gallium (Au—Ge—Ga) alloy on the underside of the active semiconductor layers. The open-worked Au—Ge—Ga alloy layer, as well as those surface parts of the active semiconductor layers which are left exposed by this open-worked alloy layer, is then covered with a layer of aluminum or like reflective metal. To this reflective metal layer is then bonded a baseplate, or mechanical support, of electrically conductive silicon or like material.

The Au—Ge—Ga alloy layer is known to make favorable ohmic contact with semiconductor substrates of AlGaInP or the like, so that it can reduce the forward voltage between anode and cathode. The efficiency of light emission is also enhanced as the reflective metal layer reflects the light that has been radiated toward the support substrate.

However, this second recited prior art device also proved to have its own weaknesses. One of these weaknesses arose in conjunction with the manufacturing process of the device, which involved several heat treatments. Undesired reactions took place as a result of such heat treatments between the reflective metal layer and Au—Ge—Ga regions and the neighboring parts of the active semiconductor layers. The result was a diminution of reflectivity at their interfaces. High-efficiency light-emitting devices were therefore not obtainable with as high a yield as had been expected.

Japanese Unexamined Patent Publication No. 2003-224297 suggests an interposition of an insulating layer between the reflective metal layer and an ohmic electrode. The insulating layer is partly open to permit electrical connection between the metal layer and the electrode. This construction is objectionable because it leads to a drop in reflectivity as the metal layer and the electrode are easy to make an alloying reaction through the open insulating layer.

A further suggestion for higher efficiency of light emission is made by Japanese Unexamined Patent Publication No. 11-4020, proposing an insertion of a current blocking region of an n-type semiconductor between a transparent electrode and p-type ohmic contact layer. Positioned in register with a bonding pad overlying the transparent electrode, the current blocking region is conductive to higher efficiency as it reduces the amount of current flowing in those parts of the active semiconductor layers which do not contribute to light production. Offsetting this advantage, however, is the difficulty of creating the current blocking region, which requires additional steps for LED production, adding substantively to its manufacturing cost.

SUMMARY OF THE INVENTION

The present invention has it as an object to improve the efficiency of light-emitting semiconductor devices, without the difficulties encountered heretofore.

Stated briefly, the invention provides a light-emitting semiconductor device comprising a semiconductor region which has a first and a second semiconductor layer of opposite conductivity types for generating light and which has a first major surface at which the first semiconductor layer is exposed and from which is emitted the light, and a second major surface, opposite to the first major surface, at which the second semiconductor layer is exposed. An electrode is electrically connected to the first semiconductor layer of the semiconductor region. Arranged in ohmic contact with at least part of the second major surface of the semiconductor region is an ohmic contact layer which is pervious to the light generated by the semiconductor region. A reflective layer of electrically conducting material is held against the ohmic contact layer for reflecting the light that has traversed the ohmic contact layer, back toward the semiconductor region for emission from the first major surface thereof. The invention particularly features an antidiffusion layer, also pervious to the light generated by the semiconductor region, which is interposed between the ohmic contact layer and the reflective layer in order to prevent these neighboring layers from thermally diffusing from one into the other.

The transparent antidiffusion layer hereby suggested may be either electrically insulating or conducting. An insulating antidiffusion layer may be made from either one or more of silicon dioxide, titanium dioxide, magnesium oxide, nickel oxide, zinc oxide, aluminum oxide, and silicon nitride (SiN), by any such known method as sputtering, chemical vapor deposition, or vacuum deposition. An electrically conducting antidiffusion layer may be made from any of an alloy of indium oxide and stannic oxide, indium oxide, stannous oxide, zinc oxide, and nickel oxide.

The antidiffusion layer of any such composition has proved effective to bar the diffusion of the constituent element or elements of each of the ohmic contact layer and reflective layer into the other and hence to inhibit the creation of a region of alloys between these layers. Held against the ohmic contact layer via this antidiffusion layer, the reflective layer is therefore much more reflective than in the prior art case where it is held directly against the ohmic contact layer. The better reflection of the light by the reflective layer leads to a greater amount of light issuing from the device.

Preferably, the antidiffusion layer is formed to a thickness capable of gaining a quantum-mechanical tunnel effect. Current flow being then possible through the antidiffusion layer, no additional means are needed for electrical connection of the ohmic contact layer and reflective layer. Such additional means would reduce the amount of light reflected by the reflective layer, with a corresponding drop in efficiency, require additional manufacturing steps, and add to the manufacturing costs of the device. All these shortcomings can be precluded merely by imparting a quantum-mechanical tunnel effect to the antidiffusion layer through its thickness adjustment.

The above and other objects, features and advantages of this invention will become more apparent, and the invention itself will best be understood, from a study of the following description and appended claims, with reference had to the attached drawings showing some preferable embodiments of the invention.

DESCRIPTION OF THE PREFERRED EMBODIMENTS

Figure 1:
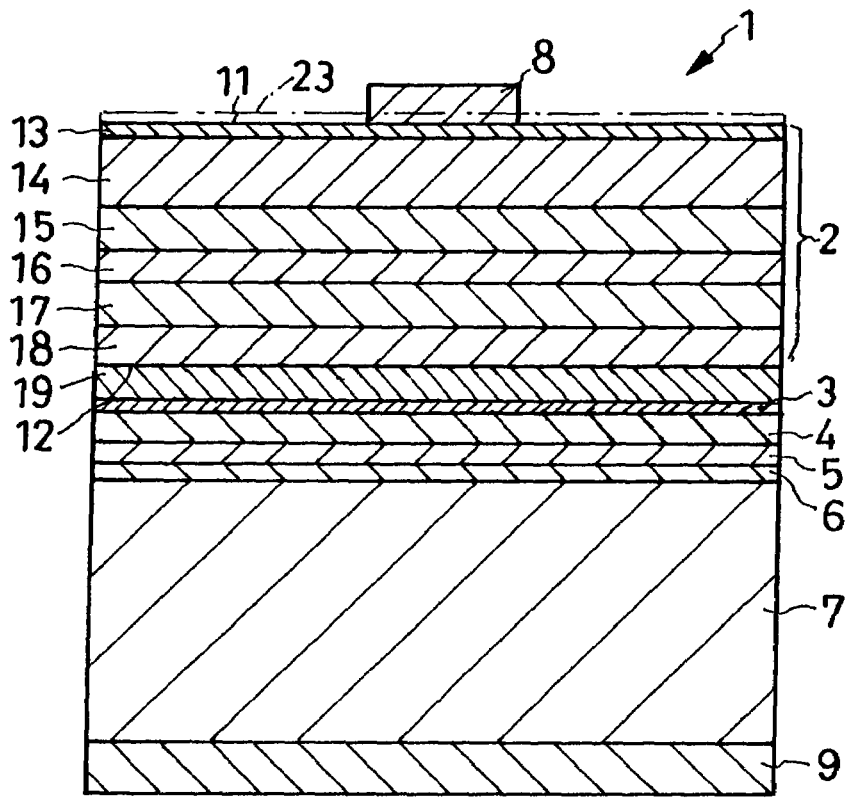
FIG. 1 is a schematic cross section through a preferred form of light-emitting diode embodying the principles of this invention.
Figure 2:
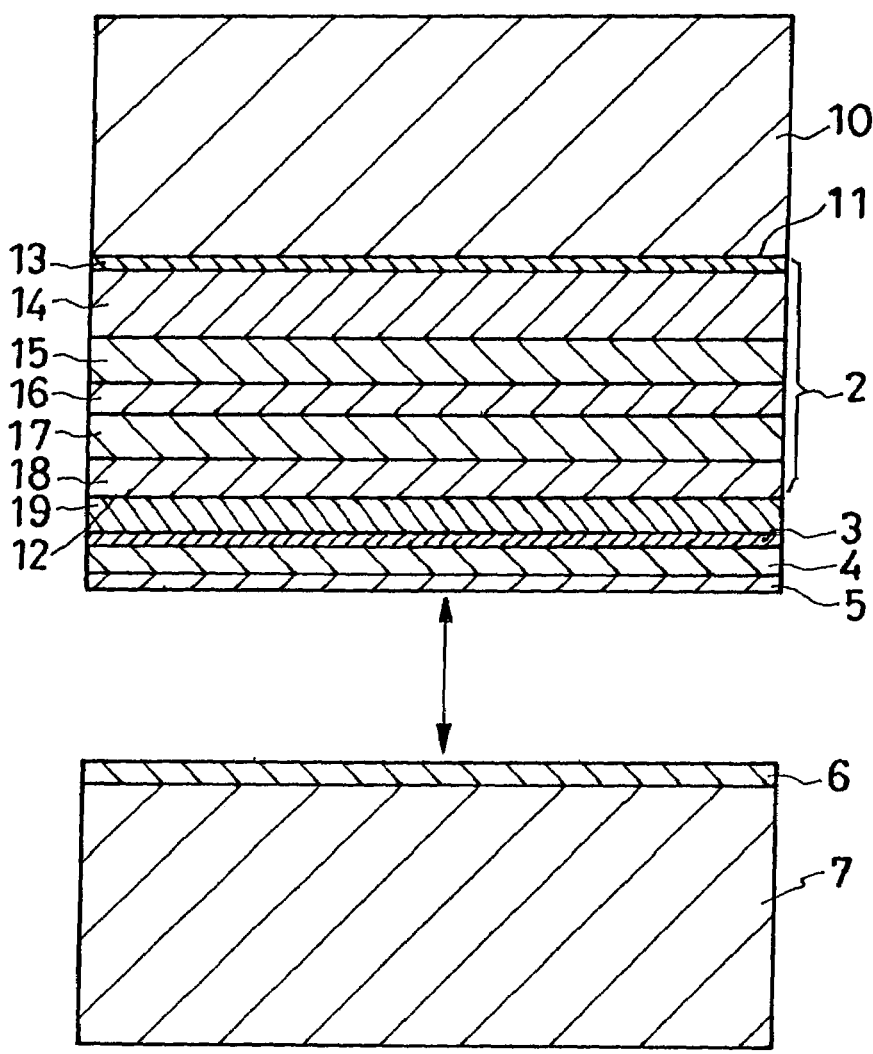
FIG. 2 is a view similar to FIG. 1 but explanatory of how the light-emitting diode is fabricated.

The present invention is currently believed to be best embodied in the double heterojunction LED shown completed in FIG. 1 and in a state of fabrication in FIG. 2. Generally designated 1 in FIG. 1, the exemplified LED has a semiconductor region 2 where light is produced and which is composed of several laminated layers 13–18 to be set forth shortly. The semiconductor region 2 might also be termed the main semiconductor region of the LED. Under this semiconductor region 2 there are provided an ohmic contact or electrode layer 19, an antidiffusion layer 3 of transparent and, in this particular embodiment, electrically insulating material constituting the gist of the instant invention, a reflective, electrically conducting layer 4, two bonding metal layers 5 and 6, and a baseplate 7 of electrically conducting silicon. A first electrode or cathode 8 is arranged centrally on top of the semiconductor region 2. A second electrode or anode 9 underlies the baseplate 7.

The baseplate 7 is different from a substrate 10, FIG. 2, which is used for growing thereon the semiconductor region 2 and other layers 19, 3–5 of the LED 1. The substrate 10 is not seen in FIG. 1 because it is removed upon completion of such region and layers. The baseplate 7 is bonded, via the bonding metal layers 5 and 6, to the reflective layer 4 either before or after the removal of the substrate 10, as will become more apparent from the description, to be given subsequently, of the method of making this LED 1.

Composed of the semiconductors of the compounds of Groups III–V elements, the semiconductor region 2 is a lamination of an n-type first complementary layer 13, an n-type second complementary layer 14, an n-type semiconductor layer or cladding 15, an active layer 16, a p-type semiconductor layer or cladding 17, and a p-type third complementary layer 18, arranged in that order from one major surface 11 of the semiconductor region 2 toward the other 12. The light generated by the active layer 16 is emitted from the major surface 11.

All the constituent layers 13–18 of the semiconductor region 2 may be made as aforesaid from the Groups III–V compounds. Preferably, however, they may contain either of the Group V elements of phosphorus, nitrogen and arsenic and one or more of the Group III elements of aluminum, gallium and indium.

Out of the constituent layers of the semiconductor region 2, it is the n-type semiconductor layer 15, active layer 16 and p-type semiconductor layer 17 that are essential for light production in this double heterojunction LED. The complementary layers 13, 14 and 18 are unessential; indeed, all or some of these unessential layers may be omitted. Even the active layer 16 may be omitted, and the n-type semiconductor layer 15 and p-type semiconductor layer 17 placed in direct contact with each other, if the LED need not be of double heterojunction configuration. It is therefore only the semiconductor layers 15 and 17 of the opposite conductivity types that are needed for generation of light.

The ohmic contact layer 19 might be considered a part of the semiconductor region 2 in cases where it is made from a semiconductor, as will be detailed later. It is from the major surface 11 of the semiconductor region 2 that this LED 1 emits the light radiated from the active layer.

More detailed explanations of the individual layers of the LED 1 follow. Interposed between the semiconductor layers 15 and 17, the active layer 16 is made from any of Group III–V compound semiconductors, which for the best results are generally expressed as:

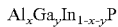

where the subscripts x and y are both equal to or greater than zero and equal to or less than one, and the sum of x and y is equal to or greater than zero and equal to or less than one.

No conductivity determinant is added to the active layer 16 in this embodiment of the invention. In practice, however, the active layer 16 may be doped with a p-type determinant to a concentration less than that of the p-type semiconductor layer 17, or with an n-type determinant to a concentration less than that of the n-type semiconductor layer 15. The showing of the single active layer 16 in FIG. 1 is for the sake of simplicity only; in practice, it may take the form of either multiple or single quantum well configuration.

Alternatively, the active layer 16 may be made from any of the nitride semiconductors that are generally defined as

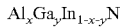

where the subscripts x and y are both equal to or greater than zero and equal to or less than one, and the sum of x and y is equal to or greater than zero and equal to or less than one.

The n-type semiconductor layer 15 overlying the active layer 16 may be fabricated from any of Group III–V compound semiconductors plus an n-type impurity such as silicon. For the best results, these semiconductors are generally defined as:

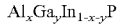

where the subscript x is equal to or greater than zero and less than one; the subscript y is equal to or greater than zero and equal to or less than one; and the sum of x and y is equal to or greater than zero and equal to or less than one.

In order to cause emission of the greatest possible percentage of the light generated in the active layer 16, the aluminum proportion x of the semiconductor layer 15 should be greater than that of the active layer 16, preferably from about 0.15 to about 0.45, and most desirably from about 0.2 to about 0.4. The gallium proportion y of the semiconductor layer 15 is from about 0.15 to about 0.35, or from about 0.4 to about 0.6 for the best results. The concentration of the n-type impurity in this layer 15 may be not less than $5 \times 10^{17}$ cm$^{-3}$. The bandgap of the layer 15 is greater than that of the active layer 16.

Alternatively, the semiconductor layer 15 may be made from any of the nitride semiconductors that are generally defined as:

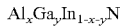

where the subscripts x and y are both equal to or greater than zero and equal to or less than one, and the sum of x and y is equal to or greater than zero and equal to or less than one.

The p-type semiconductor layer 17 underlying the active layer 16 may be of any of the Group III–V compound semiconductors plus a p-type impurity such as zinc. For the best results, these semiconductors are generally defined as:

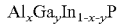

where the subscripts x and y are both equal to or greater than zero and equal to or less than one, and the sum of x and y is equal to or greater than zero and equal to or less than one.

In order to cause emission of the greatest possible percentage of the light generated in the active layer 16, the aluminum proportion x of the p-type semiconductor layer 17 should be greater than that of the active layer 16, from about 0.15 to about 0.50 for the best results. The concentration of the p-type impurity in this layer 17 may be not less than $5 \times 10^{17}$ cm$^{-3}$. The bandgap of the layer 17 is greater than that of the active layer 16.

Alternatively, the p-type semiconductor layer 17 may be made from any of the nitride semiconductors that are generally expressed as:

where the subscripts x and y are both equal to or greater than zero and equal to or less than one, and the sum of x and y is equal to or greater than zero and equal to or less than one.

The second complementary layer 14 on the n-type semiconductor layer 15 could be called a current spreading layer as it serves primarily for constancy of forward current distribution by spreading the current outwardly of the cathode 8 as seen in a direction normal to the major surface 11 of the semiconductor region. The second complementary layer 14 also functions to spread toward the lateral edges of 14 also functions to spread toward the lateral edges of the device the light that has been generated in the active layer 16. The material chosen for the second complementary layer 14 in this embodiment of the invention is n-type GaAs, although other n-type Group III–V compound semiconductors could be employed as well, examples being GaP, Ga$_x$In$_{1-x}$P, Al$_x$Ga$_{1-x}$As, or Al$_x$Ga$_y$In$_{1-x-y}$N.

The topmost n-type first complementary layer 13 could be termed a contact layer, being intended primarily for good ohmic contact with the cathode 8. The secondary function of this complementary layer 13 is to terminate the progress of etching during manufacture of the LED, as will be detailed presently. The first complementary layer 13 can be made from, in addition to an n-type impurity, any of the compound semiconductors that can be generally defined as:

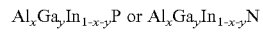

where the subscripts x and y are both equal to or greater than zero and equal to or less than one, and the sum of x and y is equal to or greater than zero and equal to or less than one.

The third complementary layer 18 underlying the semiconductor layer 17 might also be termed a current spreading layer as its primary function is to make constant the distribution of forward current. The third complementary layer 18 is designed more specifically to spread the current outwardly of the cathode 8 as seen in a direction normal to the major surface 11 of the semiconductor region 2. Group III–V compound semiconductors may be used for fabrication of the third complementary layer 2, particularly desirable among them being p-type GaP and p-type GaN. The third complementary layer 18 might also be termed a buffer layer.

Underlying the third complementary layer 18, the ohmic contact layer 19 is held against the second major surface 12 of the semiconductor region 2 in ohmic contact therewith in order to assure favorable electrical contact of this semiconductor region with the reflective layer 2. In order to assure proper functioning as an ohmic electrode, the ohmic contact layer 19 should be made from:

(a) at least either one of nickel (Ni), gold (Au), chromium (Cr), vanadium (V), titanium (Ti), cobalt (Co), palladium (Pd), iridium (Ir), osmium (Os), ruthenium (Ru) and platinum (Pt):

(b) an alloy containing at least one of the metals listed above and aluminum (Al) and copper (Cu).

(c) aluminum-germanium-gallium (Al—Ge—Ga) alloy; or (d) any of Group III–V compound semiconductors.

The particular material employed for the ohmic contact layer 19 in this embodiment of the invention is nickel-gold alloy. The ohmic contact layer 19 may be formed in a thickness (e.g. from about 0.5 to about 20.0 nanometers) to permit the passage therethrough of the light of the wavelength range (e.g. from 350 to 550 nanometers) issuing from the semiconductor region 2.

The antidiffusion layer 3 is required to be pervious to the light generated in the semiconductor region 2 and, preferably, just thick enough to provide a desired degree of quantum-mechanical tunnel effect. Held against the underside of the ohmic contact layer 19, the antidiffusion layer 3 separates the same from the underlying reflective layer 4 thereby serving to minimize the mutual diffusion and alloying of the constituent metals of these neighboring layers. The antidiffusion layer 3 may be made from either one or more of silicon dioxide ($SiO_2$), titanium dioxide ($TiO_2$), magnesium oxide (MgO), nickel oxide (NiO), zinc oxide (ZnO), aluminum oxide (AlN) and silicon nitride (SiN), by either sputtering, chemical vapor deposition, or vacuum deposition.

The antidiffusion layer 3 should be from about 0.2 to about 10.0 nanometers thick, preferably from about 0.5 to about 5.0 nanometers thick for optimal antidiffusion and quantum-mechanical tunnel effects. Should it be thinner than the lower limit of the desired thickness range, the antidiffusion layer 3 might fail to prevent the alloying of the reflective metal layer 4 and ohmic contact layer 19. If made thicker than the upper limit of the desired thickness range, on the other hand, the antidiffusion layer 3 might fail to electrically interconnect the reflective layer 4 and ohmic contact layer 19 by virtue of the tunnel effect, hampering current flow therethrough.

The reflective, electrically conducting layer 4 is shown as covering the entire surface of the antidiffusion layer 3 for reflecting the light coming from the semiconductor region 2. One or more of metals such as Al, Ag, Ru, Au and Cu, or an alloy containing one or more of these metals may be employed for making the reflective layer 4. Aluminum is used in this embodiment because it is cheaper than the other metals.

It will be appreciated that the reflective layer 4 is joined to the ohmic contact layer 19 without use of any extra bonding or connecting means. The entire surface of the reflective layer 4 is therefore dedicated to the reflection of the light from the semiconductor region 2. The reflective layer 4 should be from about 0.05 to 1.00 micrometer thick in order to be sufficiently reflective.

The electrically conductive baseplate 7 is joined to the reflective metal layer 4 via the two bonding metal layers 5 and 6 for mechanically supporting and protecting the ohmic contact layer 19, antidiffusion layer 3 and reflective layer 4. The bonding metal layers 5 and 6 may both be made from gold or like metal. Formed in thin sheets on the reflective layer 4 and baseplate 7, respectively, the bonding metal layers 5 and 6 are united with each other under heat and pressure for bonding together the baseplate and reflective layer. The baseplate 7 may be fabricated from silicon, doped with a conductivity determinant, to a thickness ranging from about 200 to 1000 micrometers, preferably 300 micrometers or so. The silicon baseplate is recommended for its cheapness, ease of machining, and good heat conductivity.

The cathode 8 of aluminum, nickel or like metal is mounted centrally on the surface 11 of the semiconductor region 2, or of the first complementary layer 13, in ohmic contact therewith. Being in the form of a bonding pad designed for connection of conductors such as wires, the cathode 8 is impervious to light. The light is therefore to issue from that part of the surface 11 which is left uncovered by the cathode 8.

Additionally, as required or desired, a transparent electrode may be formed on the major surface 11 of the semiconductor region 2, as indicated by the broken lines and designated 23 in FIG. 1. The transparent electrode 23 may be electrically coupled to the cathode 8. The transparent electrode 23 may be in the form of, for example, a thin film of an alloy of indium oxide ($In_2O_3$) and stannic oxide ($SnO_2$), or of a 5–20 nanometer thick film of silver or silver-based alloy.

The anode 9 underlies the silicon baseplate 7, covering its entire bottom surface. A metal-made baseplate may be adopted in substitution for the silicon baseplate, in which case the anode 9 will be unnecessary.

Method of Manufacture

The fabrication of the FIG. 1 LED 1 started with the preparation of a semiconductor substrate 10, FIG. 2, of GaAs. The semiconductor region 2 was formed on this GaAs substrate 10 by successively growing by epitaxy the n-type first complementary layer 13, n-type second complementary layer 14, n-type semiconductor layer 15, active layer 16, p-type semiconductor layer 17, and p-type third complementary layer 18, all using the familiar apparatus for metal organic chemical vapor deposition (MOCVD).

Then the ohmic contact layer 19, transparent antidiffusion layer 3 and reflective layer 4 were successively formed on the surface 12 of the semiconductor region 2. Either sputtering or chemical vapor deposition or vacuum deposition could be adopted for creation of these layers. Then the bonding layer 5 of gold was formed on the reflective layer 4. Heat treatment may be applied wherever necessary in fabrication of these layers. The GaAs substrate 10 was no longer necessary, so that it was etched away from the first complementary layer 13 of the semiconductor region 2. There was thus obtained a lamination of the semiconductor region 2, ohmic contact layer 19, antidiffusion layer 3, reflective layer 4, and bonding metal layer 5.

Then, as shown also in FIG. 2, there was prepared the baseplate 7 of doped silicon which, as has been stated, is to function as a mechanical support for the other constituent parts 2–5 of the LED. The silicon baseplate 7 has a thickness ranging from 200 to 1000 micrometers. The bonding layer 6 of gold was formed on one of the opposite major surfaces of the baseplate 7 by vacuum deposition. Then the bonding layers 5 and 6 were held against each other under pressure and heated to a temperature range of, say, 200–300° C., thereby causing the bonding layers 5 and 6 to unite with each other by the mutual welding of gold. The baseplate 7 was thus integrally joined to the combination of the semiconductor region 2, ohmic contact layer 19, antidiffusion layer 3 and reflective layer 4 via the bonding layers 5 and 6. The heat applied for such bonding is conducive to the stabilization of the contact layer 19 and reflective layer 4.

The GaAs substrate 10 could be etched away from the first complementary layer 13 of the semiconductor region 2 after, rather than before, the baseplate 7 was bonded as above to the reflective layer 4. The LED 1 was completed as the cathode 8 and anode 9 were subsequently formed on the semiconductor region 2 and on the baseplate 7.

The advantages gained by this particular embodiment of the invention may be recapitulated as follows:

1. The reflective layer 4 and ohmic contact layer 19 are effectively guarded against the alloying of their constituent metal or metals during the heat treatments conducted in the course of LED manufacture by virtue of the transparent, electrically insulating antidiffusion layer 3 interposed therebetween. The alloying of the constituent metals of these layers 4 and 19 would invite a substantive drop in reflectivity and, in consequence, in the efficiency of the LED. The invention enables the production of high efficiency light-emitting devices at lower costs, and with a higher yield, than heretofore.

2. Endowed with the tunnel effect, moreover, the antidiffusion layer 3 requires no extra connection between reflective layer 4 and ohmic contact layer 14, permitting full use of the area of the reflective layer for reflection of the light from the semiconductor region 2 back toward the same.

3. The antidiffusion layer 3 itself gives rise to no alloying reaction with the reflective layer 4 and ohmic contact layer 19, being created by sputtering, chemical vapor deposition, or vacuum deposition.

4. The ohmic contact layer 19 fully covers the major surface 12 of the semiconductor region 2, unlike its conventional counterpart of the open-worked Au—Ge—Ga alloy layer suggested by Japanese Unexamined Patent Publication No. 2002-217450, supra. The reflective layer 4 formed on this ohmic contact layer 19 is therefore flatter, permitting the baseplate 7 to be bonded more firmly.

5. Also unlike the prior art Au—Ge—Ga alloy layer, the ohmic contact layer 19 need not be patterned.

6. The two n-type complementary layers 13 and 14 and n-type semiconductor layer 15 overlying the active layer 16 assure the spreading of current laterally of the LED chip. Current is easier to flow laterally through the n-type semiconductor than through the p-type in the semiconductor region 2. Current spreading from the cathode 8 toward the periphery of the active layer 16 is therefore more favorable in this LED 1 than if the light were emitted from the p-type semiconductor.

7. The spread of current from the cathode 8 toward the periphery of the active layer 16 is even more expedited because, in the semiconductor region 2, the total thickness of the two n-type complementary layers 13 and 14 and n-type semiconductor layer 15, all on one side of the active layer 16, is made greater than the total thickness of the p-type semiconductor layer 17 and p-type complementary layer 18, both on the other side of the active layer 16.

Figure 3:
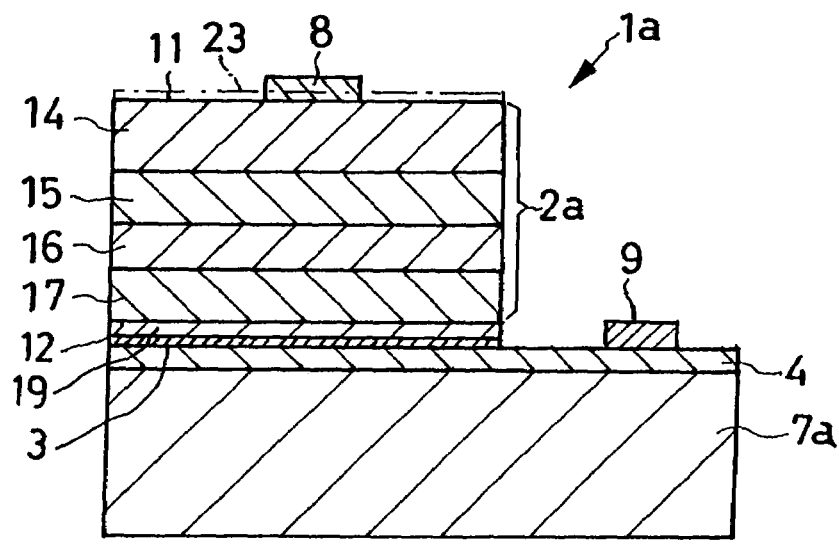
FIG. 3 is a view similar to FIG. 1 but showing a second preferred form of light-emitting diode embodying the principles of the invention.

Embodiment of FIG. 3

FIG. 3 illustrates another preferred form of LED $1_a$ according to the invention, which differs from its FIG. 1 counterpart in having a modified semiconductor region $2a$, modified baseplate $7_a$, and modified positioning of the anode 9. The modified semiconductor region $2_a$ is akin to its FIG. 1 equivalent 2 except for the absence of the first and third complementary layers 13 and 18. The cathode 8 is therefore mounted on the surface 11 of the n-type complementary layer 14, which might be more aptly termed the current spreading layer in this alternate embodiment of the invention. Further, as the third complementary layer 18 is absent, the ohmic contact layer 19 makes ohmic contact with the p-type semiconductor region 17.

It will be further observed from FIG. 3 that the modified baseplate $7_a$ and the reflective layer 4 thereon have portions projecting laterally beyond the overlying semiconductor region $2_a$. The anode 9 is placed on the ledge thus formed by the baseplate $7_a$ and reflective layer 4, making direct contact with the reflective layer 4. It is understood that the reflective layer 4 is affixed to the baseplate $7_a$ via bonding meal layers similar to those indicated at 5 and 6 in FIGS. 1 and 2. The baseplate 7a is fabricated from a metal that is a good conductor of heat, for the purpose of greater heat dissipation. The LED $1_a$ is similar to the FIG. 1 embodiment in all the other details of construction.

It will be noted that in this LED $1_a$, too, the reflective layer 4 is joined to the surface 12 of the semiconductor region $2_a$ via the antidiffusion layer 3 and ohmic contact layer 19. Thus the LED $1_a$ gains the same advantages as does the FIG. 1 LED 1.

Figure 4:
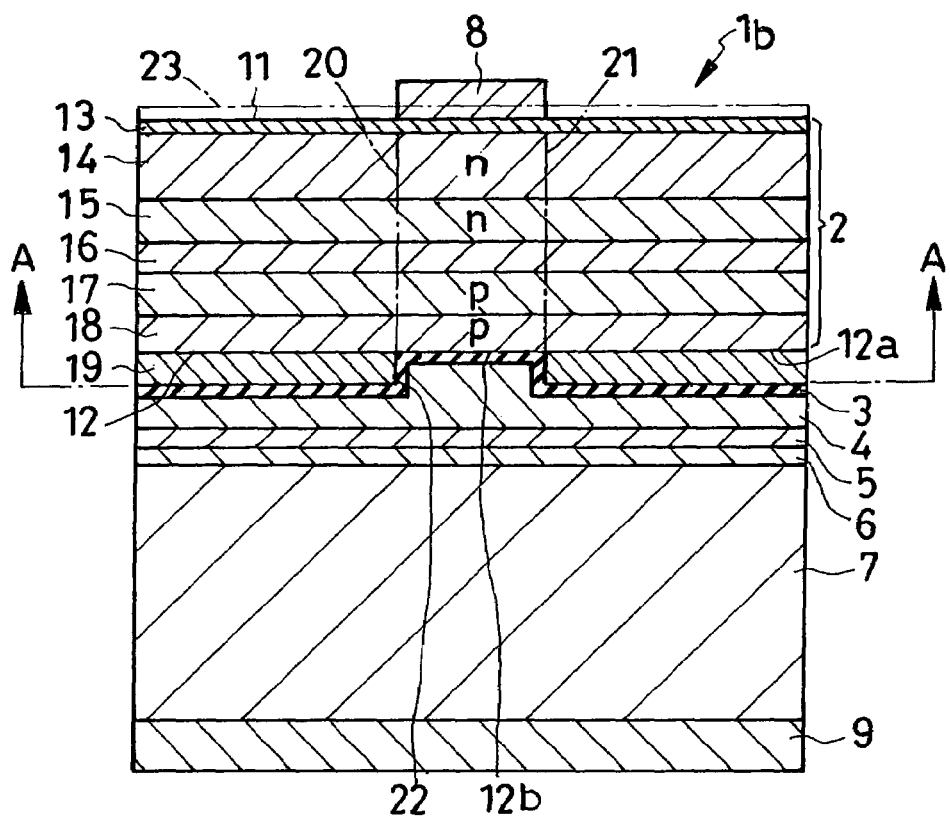
FIG. 4 is a view similar to FIG. 1 but showing a third preferred form of light-emitting diode embodying the principles of the invention.
Figure 5:
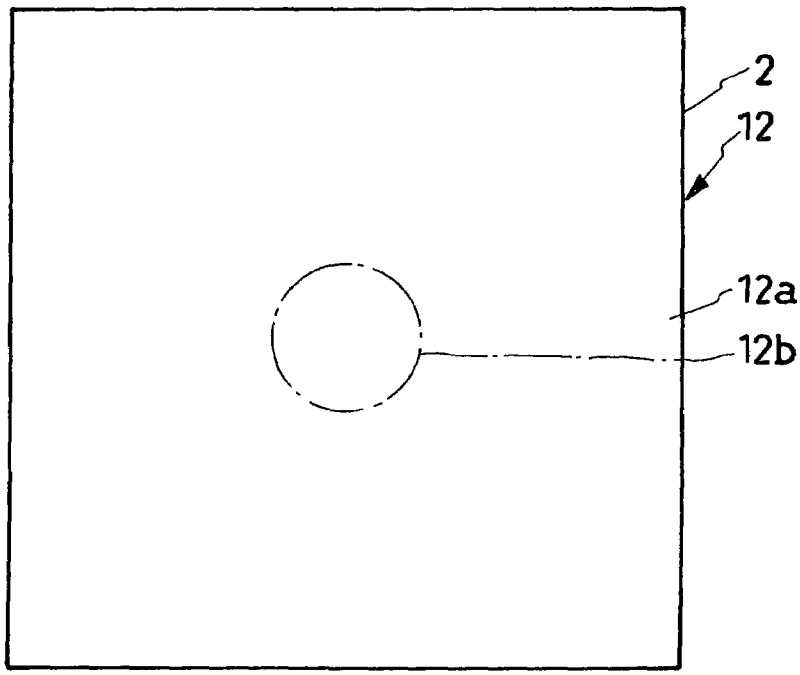
FIG. 5 is a section through the light-emitting diode of FIG. 4, taken along the line A—A therein.
Figure 6:
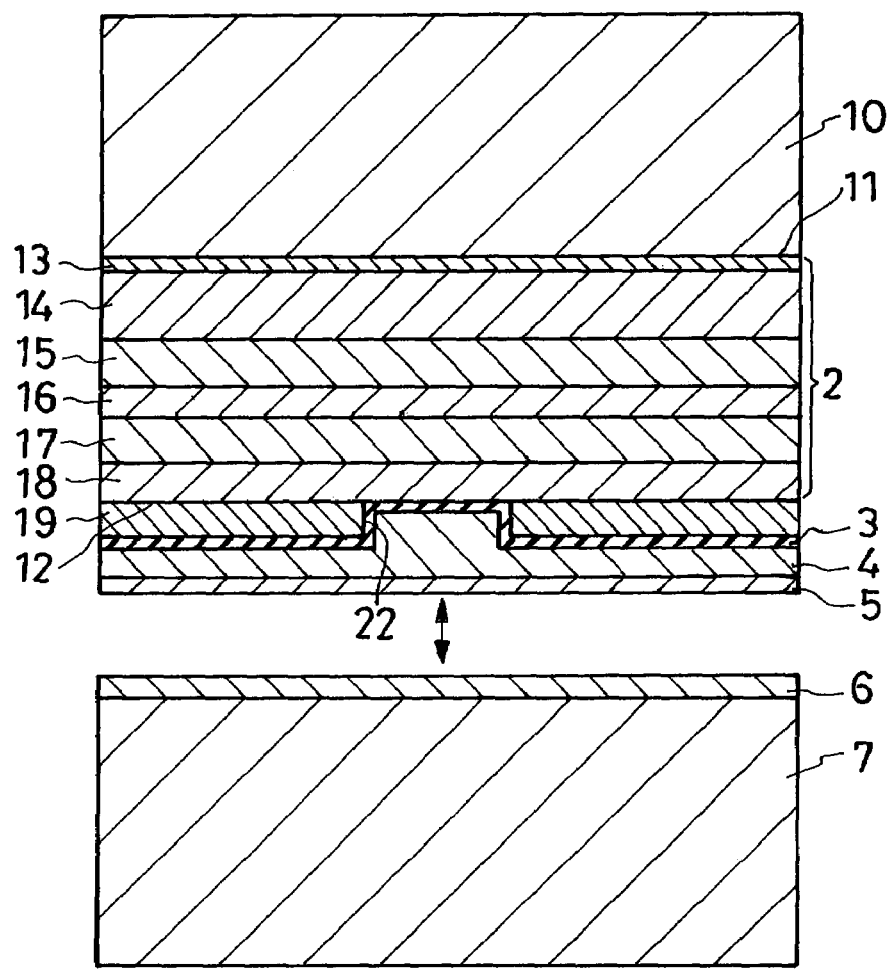
FIG. 6 is a view similar to FIG. 2 but explanatory of how the light-emitting diode of FIG. 4 is made.

Embodiment of FIGS. 4–6

Still another modified LED $1_b$ shown in FIGS. 4–6 features a current blocking orifice 22 bored centrally in the ohmic contact layer 19. By being so bored, the ohmic contact layer 19 leaves exposed central part $12_b$ of the major surface 12 of the semiconductor region 2, covering the rest $12_a$ of the semiconductor region major surface 12. The orifice 22 is in register with the cathode 8 on the other major surface 11 of the semiconductor region 2, as indicated by the dot-and-dash lines designated 20 and 21 in FIG. 4, and so, therefore, is the exposed central part $12_b$ of the major surface 12 of the semiconductor region 2. The LED $1_b$ is akin to its FIG. 1 counterpart 1 in all the other details of construction.

Notwithstanding the showings of FIGS. 4–6, the creation of the current blocking orifice 22 in the ohmic contact layer 19 is not a requirement; in other words, it is not a requirement that the ohmic contact layer 19 be 100 percent in contact with the outer part $12_a$ of the semiconductor region major surface 12 and 100 percent out of contact with its central part $12_b$. Speaking more broadly, the ohmic contact layer 19 may contact the outer part $12_a$ with a first density, and the central part $12_b$ with a second density that is less than the first. The term "first density" as used herein and in the claims appended hereto is hereby defined as the ratio (or percentage) of the total surface area of that part, or those parts, of the ohmic contact layer 19 which contact the outer part $12_a$ of the semiconductor region major surface 12, to the surface area of that outer part $12_a$. The term "second density" means, then, the ratio (or percentage) of the total surface area of that part, or those parts, of the ohmic contact layer 19 which contact the central part $12_b$ of the semiconductor region major surface 12, to the surface area of that central part $12_b$.

In practice the first density may be from about 0.7 to 1.0 (from about 80 to 100 percent), and the second density from zero to about 0.3 (from zero to about 30 percent). Most desirably, the first density is unity (ohmic contact layer 19 in 100-percent contact with the outer part $12_a$ of the semiconductor region major surface 12), and the second density zero (100 percent out of contact with the central part $12_b$ of the semiconductor region major surface 12), for maximum possible current blocking and maximum possible current spreading.

The antidiffusion layer 3 covers not only the unorificed part of the ohmic contact layer 19 but also its surface defining the orifice 22 and the exposed central part $12_b$ of the semiconductor region major surface 12. The reflective layer 4 is partly received in the orifice 22 and makes contact with the exposed central part $12_b$ of the semiconductor region major surface 12 via the antidiffusion layer 3. Although the reflective layer 4 is shown in FIG. 4 as having a flat surface against the bonding metal layer 5, a depression may be created in this surface of the reflective layer as a result of the orifice 22. Such a depression will present no problem at all from the standpoint of LED efficiency.

FIG. 6 illustrates a step in the fabrication of the modified LED $1_b$ of FIGS. 1 and 2. The baseplate 7 is here shown being bonded to the lamination of the semiconductor region 2, ohmic contact layer 19, transparent antidiffusion layer 3 and reflective, conducting layer 4. The substrate 10, still shown attached to the semiconductor region 2, could be removed before bonding the baseplate 7, as has been stated in conjunction with FIG. 2. The orifice 22 may be formed in the ohmic contact layer 19 either by patterning this later at the time of its fabrication or by etching the prefabricated layer.

The LED $1_b$ offers the advantage of further enhancement in efficiency, in addition to all the advantages set forth in connection with the FIG. 1 embodiment. Created in the ohmic contact layer 19 in register with the cathode 8, the orifice 22 serves to reduce the amount of current flow through central part of the active layer 16 and cause a greater amount of current flow to the outer part $12_a$, FIGS. 4 and 5, of the semiconductor region major surface 12. The orifice 22 is just as effective as, but cheaper and easier of fabrication than, the known current blocking layer for a higher efficiency of light production.

Figure 7:
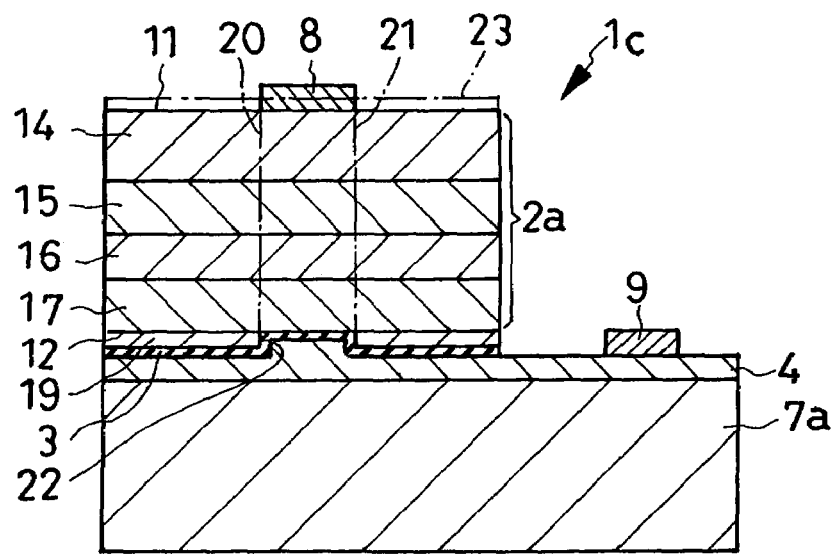
FIG. 7 is a view similar to FIG. 1 but showing a fourth preferred form of light-emitting diode embodying the principles of the invention.

Embodiment of FIG. 7

FIG. 7 shows a further modified LED $1_c$ which is similar in construction to the FIGS. 4–6 embodiment except that the former incorporates the modified semiconductor region $2_a$ and modified baseplate $7_a$ of FIG. 3 and has the anode 9 mounted in the same position as in FIG. 3. Thus, having the orifice 22 in the ohmic contact layer 19, the LED $1_c$ possesses the same advantages as does the FIG. 4 LED $1_b$.

Figure 8:
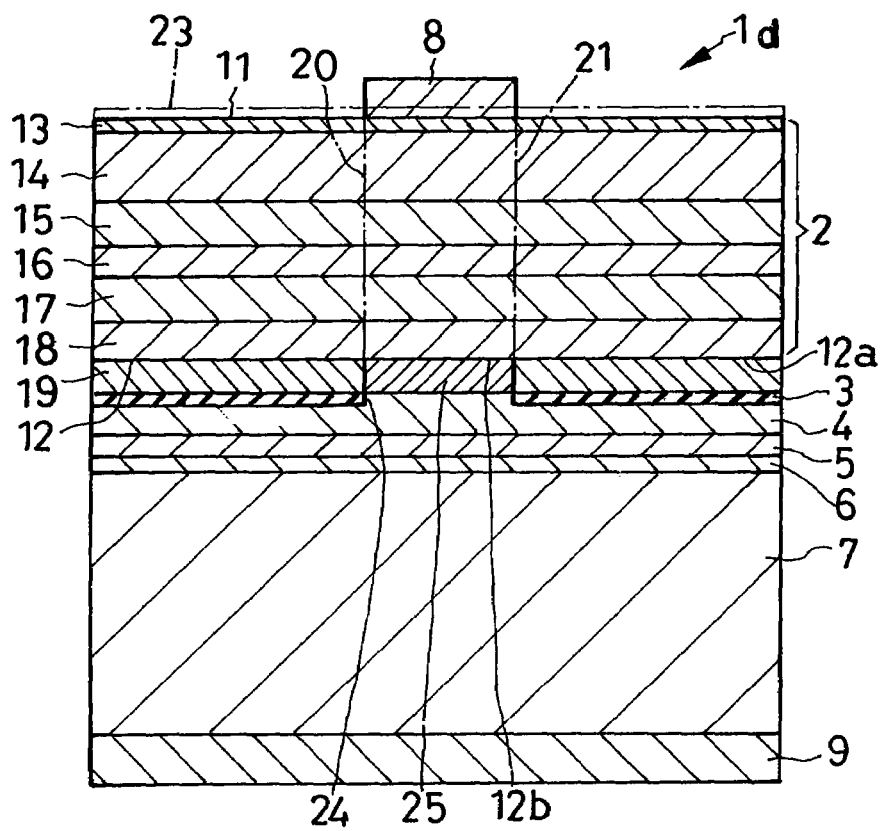
FIG. 8 is a view similar to FIG. 1 but showing a fifth preferred form of light-emitting diode embodying the principles of the invention.

Embodiment of FIG. 8

FIG. 8 is shown a further modified LED $1_d$ which is similar to the FIG. 4 LED $1_b$ except that the former has a non-ohmic alloy region 25 in place of the orifice 22 in the ohmic contact layer 19 of the latter. Another difference is that the LED $1_d$ has a window 24 formed in its antidiffusion layer 3 in register with the non-ohmic alloy region 25 and therefore with the cathode 8.

While the non-ohmic alloy region 25 may be made in a variety of ways, perhaps the simplest of them all is to create this region as an alloy of the constituent metals of the reflective layer 4 and ohmic contact layer 19. Toward this end the ohmic contact layer 19 may first be formed over the entire major surface 12 (comprising both outer part $12_a$ and central part $12_b$) of the semiconductor region 2. Then the antidiffusion layer 3 with the window 24 may be formed on the ohmic contact layer 19. Then the reflective layer 4 may be formed on the windowed antidiffusion layer 3. Then the article may be heated to cause the constituent metals of the reflective layer 4 and ohmic contact layer 19 to alloy with each other through the window 24 in the antidiffusion layer 3.

Contacting the central part $12_b$ of the semiconductor region major surface 12 with high resistivity, the alloy region 25 functions to block current flow, causing greater current flow to the outer part $12_a$ of the semiconductor region major surface, as has been explained in reference to the FIG. 4 LED $1_b$. This LED $1_d$ may be further modified as in FIG. 7 with regard to the semiconductor region $2_a$ and the placement of the anode 9. Also, the optional transparent electrode 23 may be formed on the major surface 11 of the semiconductor region 2.

Figure 9:
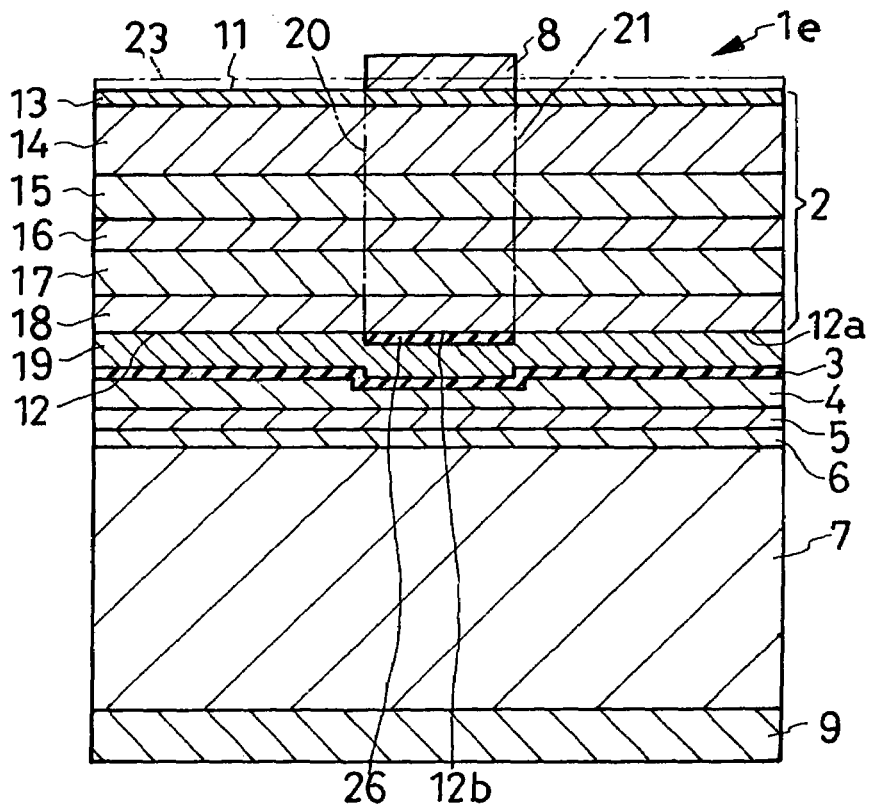
FIG. 9 is a view similar to FIG. 1 but showing a sixth preferred form of light-emitting diode embodying the principles of the invention.

Embodiment of FIG. 9

A further modified LED $1_e$ in FIG. 9 is similar in construction to the FIG. 4 LED $1_b$ except that, in substitution for the orifice 22 in the ohmic contact layer 19 in the latter, an insulating region 26 is interposed centrally between semiconductor region 2 and ohmic contact layer 19. Arranged in register with the cathode 8, the insulating region 26 functions to prevent the ohmic contact layer 19 from making direct, ohmic contact with the central part $12_b$ of the semiconductor region major surface 12. Thus the insulating region 26 functions just like the orifice 22 of the FIG. 4 embodiment.

Figure 10:
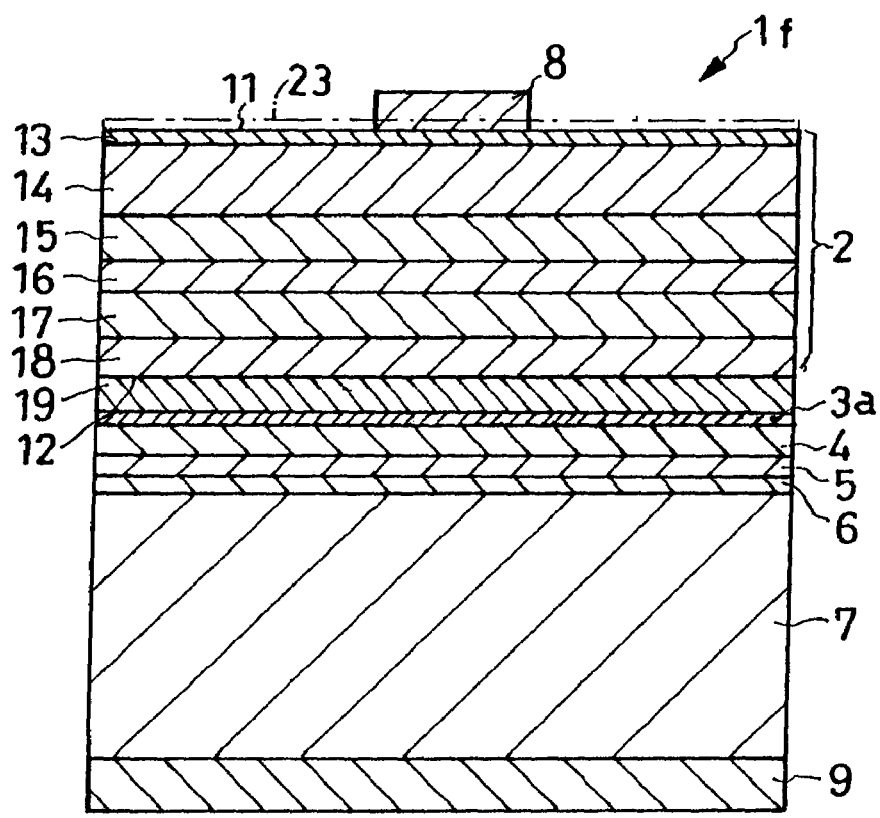
FIG. 10 is a view similar to FIG. 1 but showing a seventh preferred form of light-emitting diode embodying the principles of the invention.

Embodiment of FIG. 10

FIG. 10 shows a still further modified LED $1_f$ which employs a transparent, electrically conducting antidiffusion layer $3_a$ in place of the transparent, electrically insulating antidiffusion layer 3 of the FIG. 1 LED 1, all the other details of construction being identical therewith. The conducting antidiffusion layer $3_a$ may be made from any of a mixture of $In_2O_3$ and $SnO_2$, indium oxide (InO), stannous oxide (SnO), zinc oxide (ZnO), and nickel oxide (NiO), to a thickness capable of offering a quantum-mechanical tunnel effect.

Like the insulating antidiffusion layer 3 of the FIG. 1 embodiment, the conducting antidiffusion layer $3_a$ prevents the diffusion of the constituent elements of the reflective layer 4 and ohmic contact layer 19 from one into the other of these neighboring layers to form an alloy layer that deteriorates the reflectivity of the reflective layer. The same conducting antidiffusion layer $3_a$ could be adopted in lieu of the insulating antidiffusion layer 3 in all of the LEDs of FIGS. 3, 4 and 6–9.

Although the light-emitting semiconductor device according to the invention has been shown and described hereinbefore in terms of several currently preferred forms, all these preferred forms are meant purely to illustrate or explain and not to impose limitations upon the invention. For instance, the baseplate shown at 7 in FIGS. 1, 4, 8 and 9 and at $7_a$ in FIGS. 3 and 4 will be unnecessary if the semiconductor region 2 or $2_a$ has sufficient mechanical strength to be self-supporting. The reflective layer 4 would then serve the purpose of anode. Another apparent modification is the reversal of the conductivity types of the constituent layers 13–15 and 17–19 of the semiconductor region 2 or $2_a$. It is also understood that the present invention embraces in its scope not only the light-emitting semiconductor device in completed form but that in semifinished chip form as well. The invention should therefore be construed broadly and in a manner consistent with the fair meaning or proper scope of the subjoined claims.

What is claimed is:

1. A light-emitting semiconductor device of improved efficiency, comprising:

(a) a semiconductor region comprising a first and a second semiconductor layer of opposite conductivity types for generating light, the semiconductor region having a first major surface at which the first semiconductor layer is exposed and from which is emitted the light, and a second major surface, opposite to the first major surface, at which the second semiconductor layer is exposed;

(b) an electrode electrically connected to the first semiconductor layer of the semiconductor region;

(c) an ohmic contact layer in ohmic contact with at least part of the second major surface of the semiconductor region, the ohmic contact layer being pervious to the light generated by the semiconductor region;

(d) a reflective layer of electrically conducting material held against the ohmic contact layer for reflecting the light that has traversed the ohmic contact layer, back toward the semiconductor region for emission from the first major surface thereof; and (e) a transparent antidiffusion layer interposed between the ohmic contact layer and the reflective layer in order to prevent the ohmic contact layer and the reflective layer from thermally diffusing from one into the other.

2. A light-emitting semiconductor device as defined in claim 1, wherein the ohmic contact layer is made from at least one metal selected from the group consisting of Ni, Au, Cr, V, Ti, Co, Pd, Ir, Os, Ru, Pt, Al, and Cu, or from an alloy containing at least one metal selected from the group consisting of Ni, Au, Cr, V, Ti, Co, Pd, Ir, Os, Ru, Pt, Al, and Cu, or from Al—Ge—Ga alloy, or from a Group III–V compound semiconductor.

3. A light-emitting semiconductor device as defined in claim 1, wherein the antidiffusion layer is made from an electrically insulating material to a thickness capable of offering a quantum-mechanical tunnel effect.

4. A light-emitting semiconductor device as defined in claim 3, wherein the insulating material is selected from the group consisting of $SiO_2$, $TiO_2$, MgO, NiO, ZnO, AlN, and SiN.

5. A light-emitting semiconductor device as defined in claim 1, wherein the antidiffusion layer is made from an electrically conducting material selected from the group consisting of a mixture of $In_2O_3$ and $SnO_2$, InO, SnO, ZnO, and NiO.

6. A light-emitting semiconductor device as defined in claim 1, wherein the reflective layer is made from at least one metal, or an alloy containing the same, that is selected from the group consisting of Al, Ag. Ru, Au, and Cu.

7. A light-emitting semiconductor device as defined in claim 1, wherein the electrode is positioned on predefined part of the first major surface of the semiconductor region, wherein the second major surface of the semiconductor region comprises first part which is out of register with the electrode and second part which is in register with the electrode, and wherein the ohmic contact layer contacts the first part of the second major surface of the semiconductor region with a first density and the second part of the second major surface of the semiconductor region with a second density that is less than the first density.

8. A light-emitting semiconductor device as defined in claim 7, wherein the first density is from about 80 to 100 percent, and the second density from zero to about 30 percent.

9. A light-emitting semiconductor device as defined in claim 1, wherein the electrode is positioned on predefined part of the first major surface of the semiconductor region, wherein the ohmic contact layer has formed therein a current-blocking orifice in register with the electrode, the current-blocking orifice exposing part of the second major surface of the semiconductor region in register with the electrode, and wherein the antidiffusion layer is formed to include a portion which is received in the current-blocking orifice and which is held against the exposed part of the second major surface of the semiconductor region.

10. A light-emitting semiconductor device as defined in claim 1, wherein the electrode is positioned on predefined part of the first major surface of the semiconductor region, and wherein the ohmic contact layer is formed to include a nonohmic alloy region in register with the electrode, the nonohmic alloy region containing a constituent metal of the reflective layer.

11. A light-emitting semiconductor device as defined in claim 1, wherein the electrode is positioned on predefined part of the first major surface of the semiconductor region, and wherein the device further comprises a current-blocking insulating region held against part of the second major surface of the semiconductor region and arranged in register with the electrode.

12. A light-emitting semiconductor device as defined in claim 1, further comprising a baseplate attached to the reflective layer.

13. A light-emitting semiconductor device as defined in claim 12, wherein the baseplate is of an electrically conducting material.

14. A light-emitting semiconductor device as defined in claim 13, further comprising a second electrode coupled to the baseplate.

15. A light-emitting semiconductor device as defined in claim 1, further comprising a third electrode of transparent material formed on the first major surface of the semiconductor region, the first recited electrode being coupled to the third electrode.

* * * * *